United States Patent [19]
Fu et al.

[11] Patent Number: 5,581,182
[45] Date of Patent: Dec. 3, 1996

[54] METHOD AND APPARATUS FOR BROADBAND DECOUPLING IN NUCLEAR MAGNETIC RESONANCE WITH CHIRP PULSES

[75] Inventors: Riqiang Fu; Geoffrey Bodenhausen, both of Tallahassee, Fla.

[73] Assignee: Florida State University, Tallahassee, Fla.

[21] Appl. No.: 504,171

[22] Filed: Jul. 19, 1995

[51] Int. Cl.$^6$ ..................................................... G01V 3/00
[52] U.S. Cl. ........................................... 324/309; 324/307
[58] Field of Search ..................................... 324/300, 307, 324/309, 310, 311, 312, 313, 314, 318, 322; 128/653.1, 653.2, 653.3

[56] References Cited

U.S. PATENT DOCUMENTS

| | | | |
|---|---|---|---|
| 4,443,761 | 4/1984 | Levitt | 324/311 |
| 4,470,014 | 9/1984 | Levitt et al. | 324/311 |
| 4,682,106 | 7/1987 | Vatis et al. | 324/307 |
| 4,959,612 | 9/1990 | Luyten | 324/311 |
| 5,073,752 | 12/1991 | DeMeester et al. | 324/309 |
| 5,126,671 | 6/1992 | Bodenhausen et al. | 324/309 |
| 5,327,086 | 7/1994 | Bodenhausen et al. | 324/307 |
| 5,384,573 | 1/1995 | Turpin | 128/653.1 |

OTHER PUBLICATIONS

R. Tycko et al., "Iterative Schemes for Broad–Band and Narrow–Band Population Inversion," Chemical Physics Letters, vol. 111, No. 4,5, pp. 462–467 (1984).
A. J. Shaka et al., "Broadband Spin Decoupling in Isotropic Liquids," Progress in NMR Spectroscopy, vol. 19, pp. 47–129 (1987).
Toshimichi Fujiwara et al., "Composite Inversion Pulses with Frequency Switching and Their Application to Broadband Decoupling," Journal of Magnetic Resonance 77, pp. 53–63 (1988).
T. Fujiwara et al., "Communications: Frequency–Switched Composite Pulses for Decoupling Carbon–13 Spins Over Ultrabroad Bandwidths," Journal of Magnetic Resonance, Series A 104, pp. 103–105 (1993).
Zenon Starčuk, Jr., et al., "Heteronuclear Broadband Spin-Flip Decoupling with Adiabatic Pulses," Journal of Magnetic Resonance, Series A 107, pp. 24–31 (1994).
M. Robin Bendall, "Broadband and Narrowband Spin Decoupling Using Adiabatic Spin Flips," Journal of Magnetic Resonance Series A 112, pp. 126–129 (1995).
M. S. Silver et al., "Selective Population Inversion in NMR," Nature vol. 310, pp. 681–683 (1984).
M. S. Silver et al., "Highly Selective $\pi/2$ and $\pi$ Pulse Generation," Journal of Magnetic Resonance 59, pp. 347–351 (1984).

(List continued on next page.)

Primary Examiner—Michael Tokar
Attorney, Agent, or Firm—Senniger, Powers, Leavitt & Roedel

[57] ABSTRACT

Methods and apparatus for broadband decoupling in nuclear magnetic resonance with chirp and other RF pulses are disclosed. Such methods may include the step of positioning the sample in a static magnetic field. Additional steps may define a first cycle of pulses, such as chirp pulses, wherein at least two of the pulses have a different initial phase angle from each other and may define a second cycle of pulses wherein at least two of the pulses in the second cycle have an initial phase angle different from the initial phase angles of the pulses in the first cycle. Further steps may repeatedly generate a supercycle of the first and second cycles to produce pulses for inverting the longitudinal magnetization in the sample and may also detect the signals emitted by the sample in response to inversion of the longitudinal magnetization. Alternatively, the chirp pulses in the first and second cycles may be defined to sweep a bandwidth of 100 kHz or more. The first and second cycles may also be defined to include linear frequency modulated RF pulses wherein each of the RF pulses has an amplitude which is substantially constant during at least about 50% of the pulses. Apparatus for performing the disclosed methods is also disclosed. Other methods and apparatus are also disclosed.

30 Claims, 5 Drawing Sheets

OTHER PUBLICATIONS

M. S. Silver et al., "Selective Spin Inversion in Nuclear Magnetic Resonance and Coherent Optics Through an Exact Solution of the Bloch–Riccati Equation," Physical Review A, vol. 31, No. 4, pp. 2753–2755 (1985).

J. Böhlen et al., "Experimental Aspects of Chirp NMR Spectroscopy," Journal of Magnetic Resonance, Series A 102, pp. 293–301 (1993).

M. A. McCoy et al., "Selective Shaped Pulse Decoupling in NMR: Homonuclear [$^{13}$C] Carbonyl Decoupling," J. Am. Chem. Soc., 114, pp. 2108–2112 (1992).

R. R. Ernst, "Nuclear Magnetic Double Resonance with an Incoherent Radio–Frequency Field," The Journal of Chemical Physics, vol. 45, No. 10, pp. 3845–3861 (1966).

V. J. Basus et al., "Utilization of Chirp Frequency Modulation with 180°–Phase Modulation for Heteronuclear Spin Decoupling," Journal of Magnetic Resonance 35, pp. 19–37 (1979).

M. H. Levitt et al., "Composite Pulse Coupling," Journal of Magnetic Resonance 43, pp. 502–507 (1981).

A. J. Shaka et al., "Evaluation of a New Broadband Decoupling Sequence: WALTZ–16," Journal of Magnetic Resonance 53, pp. 313–340 (1983).

A. J. Shaka et al., "Computer–Optimized Decoupling Scheme for Wideband Applications and Low–Level Operation," Journal of Magnetic Resonance 64, pp. 547–552 (1985).

J. S. Waugh, "Theory of Broadband Spin Decoupling," Journal of Magnetic Resonance 50, pp. 30–49 (1982).

M. A. McCoy et al., "Selective Decoupling," Journal of Magnetic Resonance, Series A 101, pp. 122–130 (1993).

U. Eggenberger et al., "Frequency–Selective Decoupling with Recursively Expanded Soft Pulses in Multinuclear NMR," Journal of Magnetic Resonance 100, pp. 604–610 (1992).

M. Levitt et al., "Supercycles for Broadband Heteronuclear Decoupling," Journal of Magnetic Resonance 50, pp. 157–160 (1982).

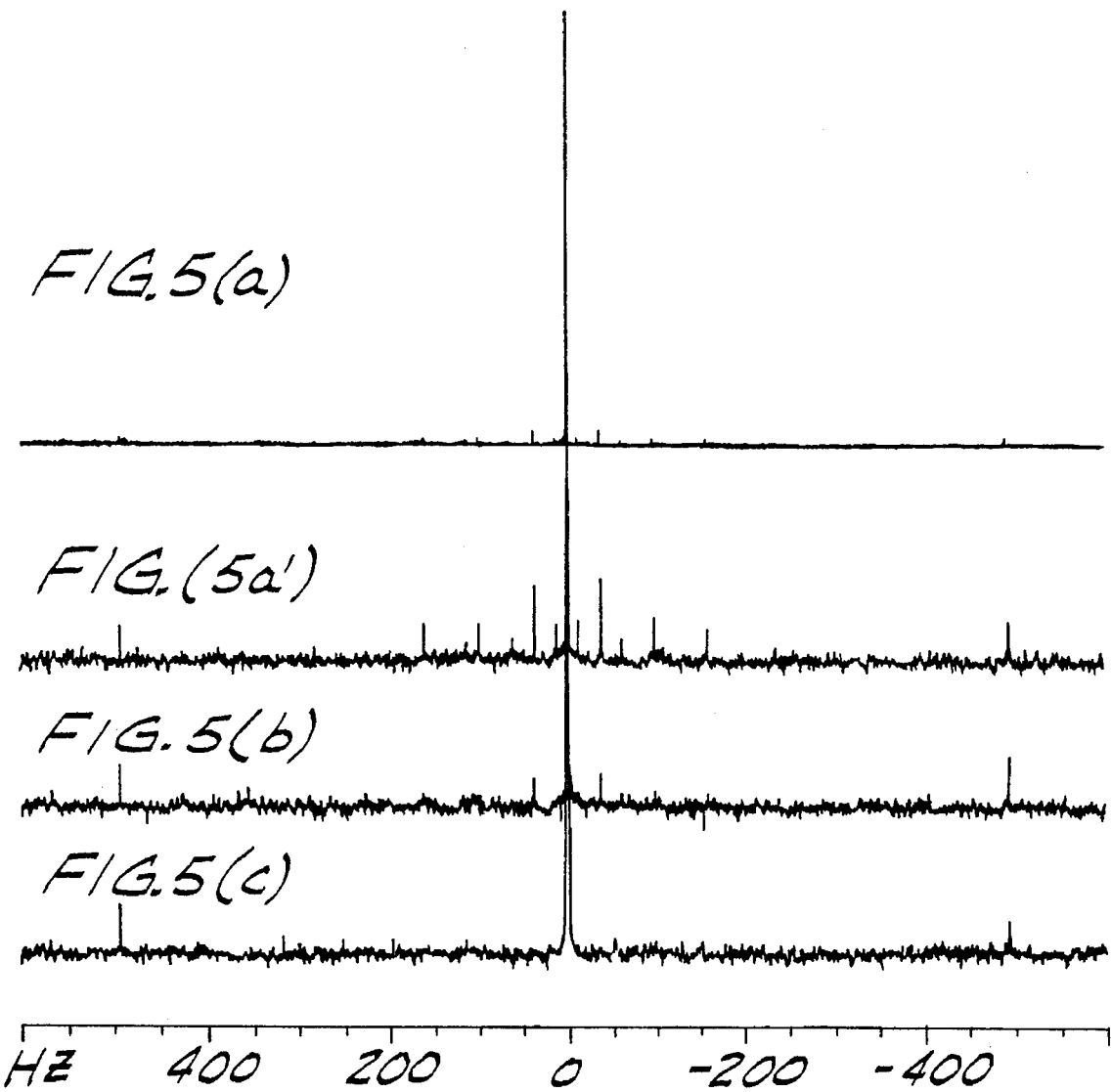

METHOD AND APPARATUS FOR BROADBAND DECOUPLING IN NUCLEAR MAGNETIC RESONANCE WITH CHIRP PULSES

BACKGROUND OF THE INVENTION

This invention relates generally to a method and apparatus for broadband decoupling scalar or dipolar couplings between nuclei in a sample by inverting a longitudinal magnetization in the sample with cycles of chirp pulses.

By way of background, broadband decoupling of scalar or dipolar couplings with spins having I=½ is one of the central challenges of nuclear magnetic resonance. As greater static magnetic fields are becoming available, the bandwidths that must be covered are increasing. For example, in a 1000 MHz spectrometer equipped with a 23.5T magnet, a bandwidth of 50 kHz is required for decoupling carbon-13 spectra of 200 ppm width. When working with conducting aqueous solutions of biological macromolecules, it is also desirable to limit the average radio frequency power to prevent sample heating. For in vivo decoupling with surface coils, decoupling methods must also be very tolerant to RF inhomogeneity.

In the past, noise decoupling has been found to be relatively inefficient and the use of singular chirp pulses has not been successful over a broad band. Other efforts, such as MLEV, WALTZ and GARP, have concentrated on sequences of phase-shifted rectangular pulses where the carrier frequency is kept constant. These sequences are derived from a combination of elements R organized into cycles and supercycles for inverting the longitudinal magnetization over as wide a bandwidth as possible. In MPF schemes, the constraint that the carrier frequency remain constant is dropped and the carrier is stepped through the spectrum in large frequency increments.

More recent broadband decoupling schemes have been built on adiabatic inversion where the carrier frequency is varied smoothly using a hyperbolic secant pulse shape in combination with 4-step and 5-step supercycles. However, these nonlinear schemes require relatively high RF amplitudes over fairly narrow bandwidths.

SUMMARY OF THE INVENTION

Among the objects of the present invention are to provide an improved method and apparatus for decoupling scalar or dipolar couplings over virtually unlimited bandwidths; the provision of such method and apparatus for decoupling scalar or dipolar couplings using chirp or other RF pulses in cycles and supercycles; the provision of such method and apparatus for decoupling scalar or dipolar couplings using chirp or other RF pulses with linear frequency modulation; the provision of such method and apparatus for decoupling scalar or dipolar couplings with limited RF power; the provision of such method and apparatus for decoupling scalar or dipolar couplings using apodized RF amplitudes; the provision of such method and apparatus for decoupling which are tolerant of RF inhomogeneity and give narrow residual linewidths and weak modulation sidebands; and the provision of such method and apparatus which are reliable and easy to use.

Generally, a method of the present invention is performed for decoupling a scalar or dipolar coupling between nuclei in a sample by inverting a longitudinal magnetization in the sample. The method includes the step of positioning the sample in a static magnetic field. The method also includes the steps of defining a first cycle of chirp pulses wherein at least two of the chirp pulses in the first cycle have a different initial phase angle from each other and defining a second cycle of chirp pulses wherein at least two of the chirp pulses in the second cycle have an initial phase angle different from the initial phase angles of chirp pulses in the first cycle. The method also includes the step of generating a supercycle comprising a plurality of the first and second cycles so that the first and second cycles are repeatedly generated as a function of the supercycle. This produces chirp pulses for inverting the longitudinal magnetization in the sample. The signals emitted by the sample in response to inversion of the longitudinal magnetization are detected.

In another aspect of the present invention, a method is performed for decoupling a scalar or dipolar coupling between nuclei in a sample by inverting a longitudinal magnetization in the sample. The method includes the step of positioning the sample in a static magnetic field. The method also includes the steps of defining a first cycle of chirp pulses having a varying phase or varying frequency to result in a frequency sweep of at least about 100 kHz and defining a second cycle of chirp pulses having a varying phase or varying frequency to result in a frequency sweep of at least about 100 kHz. The method also includes the steps of generating a supercycle comprising a plurality of the first and second cycles. The first and second cycles are repeatedly generated as a function of the supercycle to produce chirp pulses for inverting the longitudinal magnetization in the sample. The signals emitted by the sample in response to inversion of the longitudinal magnetization are detected.

In another aspect of the present invention, a method is performed for decoupling a scalar or dipolar coupling between nuclei in a sample by inverting a longitudinal magnetization in the sample. The method includes the step of positioning the sample in a static magnetic field. The method also includes the steps of defining a first cycle of linear frequency modulated RF pulses wherein each of the RF pulses in the first cycle has an amplitude which is substantially constant during at least about 50% of the pulses and defining a second cycle of linear frequency modulated RF pulses wherein each of the RF pulses in the second cycle has an amplitude which is substantially constant during at least about 50% of the pulses. The method also includes the steps of generating a supercycle comprising a plurality of the first and second cycles so that the first and second cycles are repeatedly generated as a function of the supercycle. This produces RF pulses for inverting the longitudinal magnetization in the sample. The signals emitted by the sample in response to inversion of the longitudinal magnetization are detected.

In another aspect of the present invention, apparatus is provided for decoupling a scalar or dipolar coupling between nuclei in a sample by inverting a longitudinal magnetization in the sample. The apparatus includes a magnet to produce a static magnetic field within which the sample is positioned. The apparatus also includes a memory for storing data to define a first cycle of chirp pulses. At least two of the chirp pulses in the first cycle have a different initial phase angle from each other. The data further defines a second cycle of chirp pulses. At least two of the chirp pulses in the second cycle have an initial phase angle different from the initial phase angles of chirp pulses in the first cycle. The data further defines a supercycle comprising a plurality of the first and second cycles. The apparatus also includes a pulse generator responsive to the memory for repeatedly generating a plurality of chirp pulses as a function of the supercycle of the defined first and second cycles.

The pulses are applied to the sample for inverting the longitudinal magnetization in the sample. A detector detects the signals emitted by the sample in response to inversion of the longitudinal magnetization.

In yet another aspect of the present invention, apparatus is provided for decoupling a scalar or dipolar coupling between nuclei in a sample by inverting a longitudinal magnetization in the sample. The apparatus includes a magnet to produce a static magnetic field within which the sample is positioned. The apparatus also includes a memory for storing data to define a first cycle of chirp pulses. At least two of the chirp pulses in the first cycle have a varying phase or varying frequency to result in a frequency sweep of at least about 100 kHz. The data further defines a second cycle of chirp pulses. At least two of the chirp pulses in the second cycle have a varying phase or varying frequency to result in a frequency sweep of at least about 100 kHz. The data further defines a supercycle comprising a plurality of the first and second cycles. The apparatus also includes a pulse generator responsive to the memory for repeatedly generating a plurality of chirp pulses as a function of the supercycle of the defined first and second cycles. The pulses are applied to the sample for inverting the longitudinal magnetization in the sample. A detector detects the signals emitted by the sample in response to inversion of the longitudinal magnetization.

In yet still another aspect of the present invention, apparatus is provided for decoupling a scalar or dipolar coupling between nuclei in a sample by inverting a longitudinal magnetization in the sample. The apparatus includes a magnet to produce a static magnetic field within which the sample is positioned. The apparatus also includes a memory for storing data to define a first cycle of linear frequency modulated RF pulses. Each of the RF pulses in the first cycle have an amplitude which is substantially constant during at least about 50% of the pulses. The data further defines a second cycle of linear frequency modulated RF pulses. Each of the RF pulses in the second cycle have an amplitude which is substantially constant during at least about 50% of the pulses. The data further defines a supercycle comprising a plurality of the first and second cycles. The apparatus also includes a pulse generator responsive to the memory for repeatedly generating a plurality of RF pulses as a function of the supercycle of the defined first and second cycles. The pulses are applied to the sample for inverting the longitudinal magnetization in the sample. A detector detects the signals emitted by the sample in response to inversion of the longitudinal magnetization.

Other objects and features will be in part apparent and in part pointed out hereinafter.

BRIEF DESCRIPTION OF THE DRAWINGS

FIGS. 5(a–c) show an expanded view of the center of the range shown in FIGS. 4(a–c).

Corresponding reference characters indicate corresponding parts throughout the several views of the drawings and disclosure.

DETAILED DESCRIPTION OF THE PREFERRED EMBODIMENT

Figure 1A:
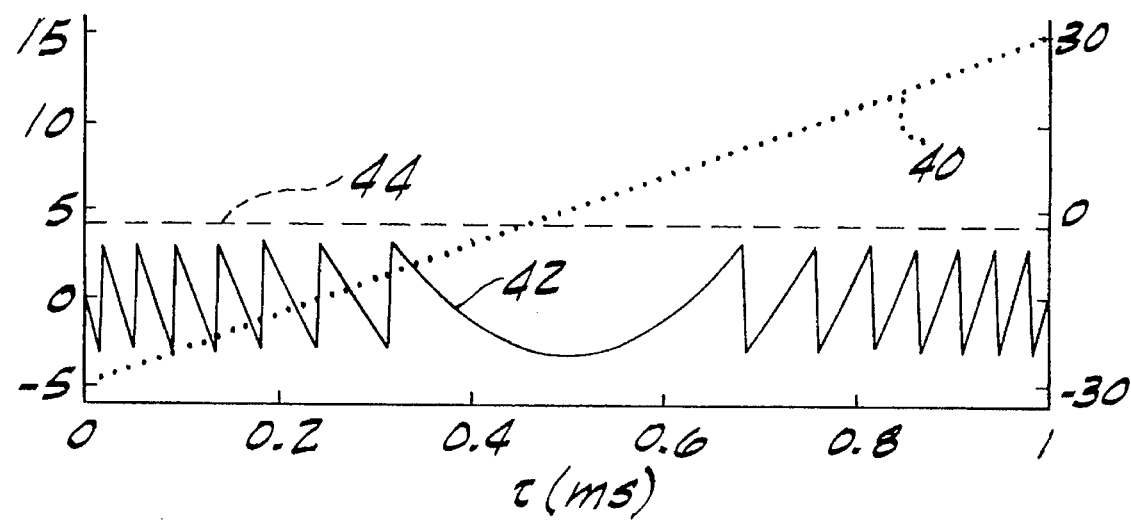
FIGS. 1(a–b) show chirp pulse waveshapes suitable for broadband inversion of longitudinal magnetization.
FIG. 1(c) shows a hyperbolic secant pulse.

Referring now to the Figures, FIGS. 1(a–b) show the waveshapes of chirp pulses that are useful for broadband adiabatic inversion of the longitudinal magnetization in a sample. A dotted line 40 in FIGS. 1(a–b) shows the carrier frequency $v_{RF}$ of the waveshapes. The carrier frequency is swept monotonically, preferably linearly, for 1 ms period over a bandwidth $\Delta v^{sweep}$=60 kHz from −30 to +30 kHz. The scale for dotted line 40 appears along the right side measured in kHz. In lieu of sweeping the frequency of the chirp pulses shown in FIGS. 1(a–b) over the 60 kHz bandwidth, the chirp pulses may be set to their central frequency (such as the Larmor frequency as explained below) indicated at zero in FIGS. 1(a–b) while the phase is varied. For example, the phase may be varied by integrating the frequency offset between the central frequency and the carrier frequency to be swept. The phase $\phi=\int\omega(t)dt$ of the frequency offset between the central frequency and the carrier frequency is shown in FIGS. 1(a–b) by a solid line 42. The phase is measured relative to a frame rotating at the central frequency and is programmed as a function of time. The scale for solid line 42 appears along the left side measured in radians. Solid line 42 is plotted in the interval $\phi=[-\pi,\pi]$. Thus, there are at least two possibilities for realizing the frequency sweep shown in FIGS. 1(a–b): (1) varying the frequency to achieve the sweep; and (2) varying the phase to achieve the same effect. Dashed lines 44 and 46 show the time dependence of the RF amplitude of the chirp pulses shown in FIGS. 1(a) and (b), respectively. The scale for dashed lines 44 and 46 appears along the left side measured in kHz.

Figure 1B:
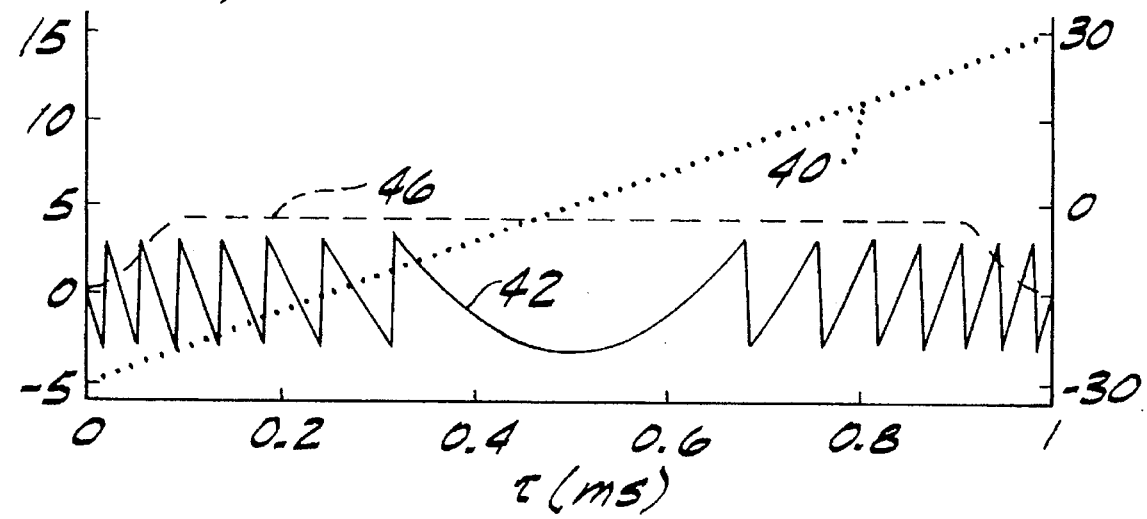

As seen, the simple linear chirp pulse of FIG. 1(a) has a phase which describes a parabola as a function of time and has a constant RF amplitude $v_{RF}$=4.2 kHz. The average power of this chirp pulse is proportional to $(v_{RF})^2$=17.64. The chirp pulse shown in FIG. 1(b) is a linear chirp pulse combined with an RF amplitude profile which has been apodized in the initial and final 10% using a half-Gaussian envelope truncated at 2.5%. The central plateau of the RF amplitude for the chirp pulse shown in FIG. 1(b) is $v_{RF,max}$=5.0 kHz. The average power of this chirp pulse is proportional to $(v_{RF,max})^2/1.16$=21.55. Other apodization techniques can also be used within the scope of the invention, such as apodizing the RF amplitude as a function of a sine wave or some other wave. It is seen, then, that in one preferred embodiment of the invention a chirp pulse may be defined as a pulse having a linear frequency sweep as shown by dotted line 40 and/or a substantially constant amplitude which may or may not be apodized as shown by dashed lines 44 and 46.

In use, the simple linear chirp pulse of FIG. 1(a) with a constant RF amplitude has the advantage that there is no need for a linear amplifier. A disadvantage to this pulse, however, is that the adiabatic condition is not easily fulfilled when the RF carrier frequency sweeps through resonance. If the RF field is too weak, the magnetization may not closely follow the effective field as it rotates from the north pole to the south pole of the accelerating rotating frame. On the other hand, a large constant RF amplitude throughout the sweep leads to violations of adiabacity at the beginning of the chirp pulse. These problems can be overcome by using an apodized amplitude profile such as that shown in FIG. 1(b).

Figure 1C:
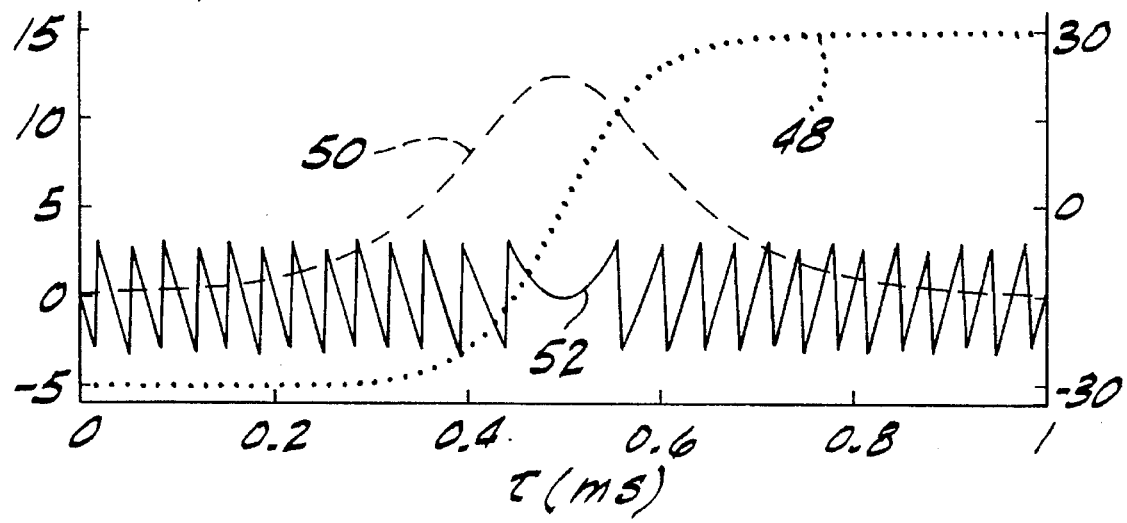

By way of distinction, FIG. 1(c) shows a hyperbolic secant pulse. The carrier frequency for this nonchirp pulse is swept along a hyperbolic secant waveshape as shown by a dotted line 48. The scale for dotted line 48 appears along the right side measured in kHz and the time duration is measured along the bottom of FIG. 1(c) in milliseconds. A dashed line 50 shows the time dependence of the RF amplitude measured along the left side in kHz. A solid line 52 shows the phase of the carrier frequency measured along the left side in radians plotted in the interval $\phi=[-\pi,\pi]$.

Figure 2:
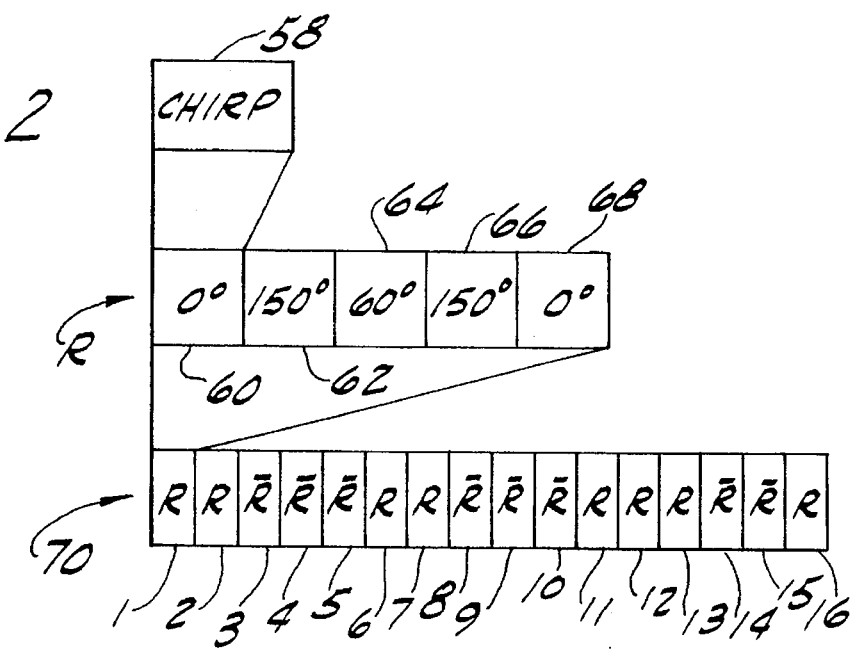
FIG. 2 shows a cycle made up of five chirp pulses which cycle is used in a supercycle made up of sixteen cycles.

FIG. 2 shows a basic chirp unit 58 for decoupling scalar or dipolar couplings between nuclei in a sample by inverting a longitudinal magnetization in the sample with cycles of chirp pulses. Chirp unit 58 is preferably a linear frequency modulated chirp pulse of duration $\tau$. Chirp unit 58 may take the form of either of the chirp pulses shown in FIGS. 1(a–b). Other chirp pulses may also be used within the scope of the invention.

FIG. 2 also shows five chirp units, 60, 62, 64, 66 and 68 combined together in a five step cycle to define a chirp cycle R of duration $5\tau$. Chirp units 60–68 are similar to each other with the exception that their respective initial phases are shifted. Chirp units 60 and 68 have an initial phase of about zero radians as shown in FIGS. 1(a–b). Chirp units 62 and 66 have an initial phase of about 150 degrees (which is converted to radians for use with the scales shown in FIGS. 1(a–b)). Chirp unit 64 has an initial phase of about 60 degrees (which is also converted to radians for use with the scales shown in FIGS. 1(a–b)). Those skilled in the art will recognize that shifting the initial phase of the chirp units causes the middle point of solid line 42 to move up and down within the layout of FIGS. 1(a–b). Thus, with respect to FIG. 2, chirp cycle R comprises a series of chirp pulses or units.

After a chirp cycle R is defined, the inverse of the chirp cycle, $\tilde{R}$, is defined by using the identical chirp units 60–68 as in chirp cycle R except that the initial phases of each of the chirp units are advanced about 180 degrees. Thus, the first and fifth chirp units in the inverse chirp cycle $\tilde{R}$ have an initial phase angle of about 180 degrees; the second and fourth chirp units in the inverse chirp cycle $\tilde{R}$ have an initial phase angle of about 330 degrees; and the third chirp unit in the inverse chirp cycle $\tilde{R}$ has an initial phase angle of about 240 degrees. Thus, inverse chirp cycle $\tilde{R}$ comprises a second series of chirp pulses or units.

The chirp cycles R and the inverse chirp cycles $\tilde{R}$ are then organized into an MLEV-16 supercycle 70 as shown in FIG. 2. Each supercycle 70 comprises a total of sixteen cycles R and $\tilde{R}$. The first cycle R fills positions 1, 2, 6, 7, 11, 12, 13 and 16 of supercycle 70 as these positions have been numbered in FIG. 2. The second cycle $\tilde{R}$ fills positions 3, 4, 5, 8, 9, 10, 14 and 15 of supercycle 70 as these positions have been numbered in FIG. 2. The total number of chirp units or pulses 58 in one supercycle 70 is thus 5×16=80.

As also seen from the Figures, the first cycle R may be defined as a first cycle of linear frequency modulated RF pulses wherein each of the RF pulses has an amplitude which is substantially constant during at least about 50% of said pulses. The second cycle $\tilde{R}$ may be defined as a second cycle of linear frequency modulated RF pulses wherein each of the RF pulses has an amplitude which is substantially constant during at least about 50% of said pulses. Each of the RF pulses in the first and second cycles may have an amplitude below about 10 kHz. In some cases, the amplitudes of the pulses may by maintained below about 6 kHz and in still others below about 4 kHz.

In practice, a method for decoupling the scalar or dipolar couplings in a sample may include the steps of providing a static magnetic field and positioning the sample in the static magnetic field. The supercycle 70 of first and second chirp cycles R and $\tilde{R}$ is then generated repeatedly to produce chirp pulses for inverting the longitudinal magnetization in the sample. The signals emitted by the sample in response to inversion of the longitudinal magnetization are then detected with a suitable detector in the spectrometer.

It has been found that the efficiency of decoupling greatly depends on the choice of supercycles. If an MLEV-4 supercycle is employed instead of an MLEV-16 supercycle, then there are particular values of offsets where decoupling is not efficient. The preferable supercycle is shown in FIG. 2.

Figure 3A:
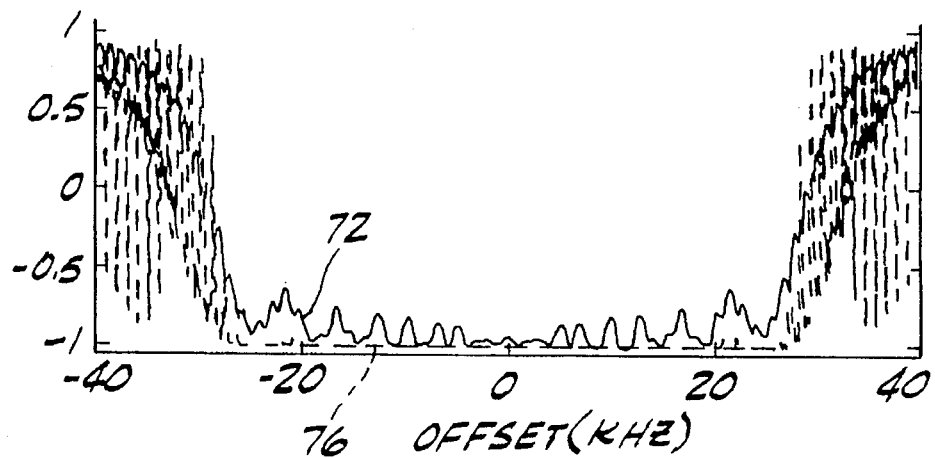
FIGS. 3(a–b) show the inversion profiles for the chirp pulse waveshapes of FIGS. 1(a–b).

FIGS. 3(a) and (b) are inversion profiles showing the expectation value $<M_z>$ as a function of offset for the chirp pulses shown in FIGS. 1(a) and (b), respectively. In particular, solid lines 72 and 74 show the inversion profiles for a single one of the chirp pulses shown in FIGS. 1(a) and (b), respectively, taken in isolation and swept from −30 to +30 kHz. In other words, solid lines 72 and 74 are the inversion profiles for these pulses without consideration of chirp cycles R and $\tilde{R}$ or of supercycles 70. An inversion value of −1 corresponds to complete population inversion. An inversion value of 1 corresponds to a sample at equilibrium. Dashed lines 76 and 78 show the inversion profiles when chirp cycle R is used. Dashed line 76 corresponds to the situation where chirp cycle R is constructed using the chirp pulse shown in FIG. 1(a) and dashed line 78 corresponds to the situation where chirp cycle R is constructed using the chirp pulse shown in FIG. 1(b). FIGS. 3(a–b) thus show that the chirp pulses of FIGS. 1(a–b) allow one to invert the longitudinal magnetization over a very broad frequency range.

Figure 3B:
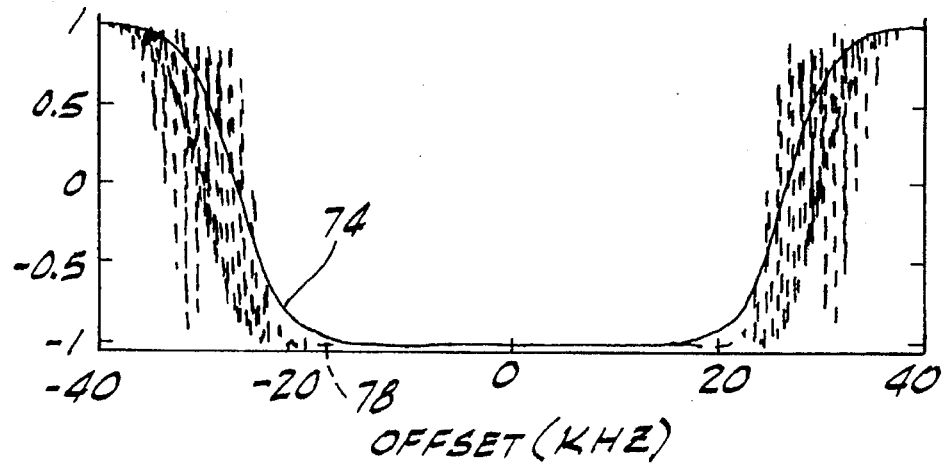

It is noted that the adiabatic condition may not be properly fulfilled using the single chirp pulse of FIG. 1(a). This may cause poor inversion performance as shown by solid line 72 in FIG. 3(a). However, this inversion performance can be dramatically improved by using a five step cycle R as shown by dashed line 76. Because the chirp pulse of FIG. 1(b) has an apodized RF amplitude at the rising and falling edges, this pulse has an improved inversion performance as shown by solid line 74. However, this improved inversion performance comes at the expense of a narrowed bandwidth as shown in FIG. 3(b). The five step cycle R causes a slight extension of the inversion bandwidth as shown by dashed line 78.

FIGS. 4(a–c) show experimental proton decoupled $^{13}C$ spectra of formic acid with $J_{CH}=221$ Hz. These signals or spectra were recorded as a function of offset between the center of the chirp range and the proton shift. The offset was stepped in 61 increments of 1 kHz from −30 to +30 kHz. Thus, $\Delta v^{sweep}=60$ kHz. The spectral width plotted for each experiment was 380 Hz so that residual splittings and modulation sidebands can be seen. Outside the central region where decoupling is efficient, the experimental spectra show broadened lines in two transition regions, while the efficiency of decoupling drops dramatically outside of these regions.

Figure 4A:
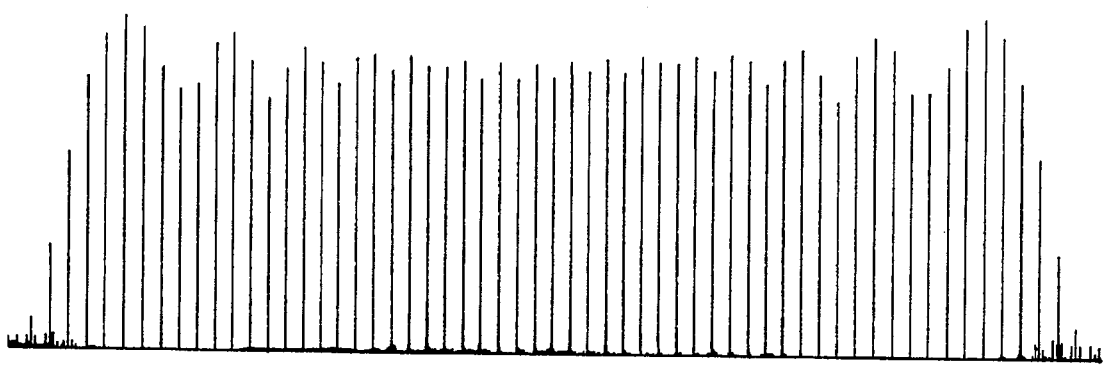
FIGS. 4(a–c) show experimental carbon-13 spectra of formic acid detected using chirp pulses with different RF amplitudes applied to the proton resonances.
Figure 4B:
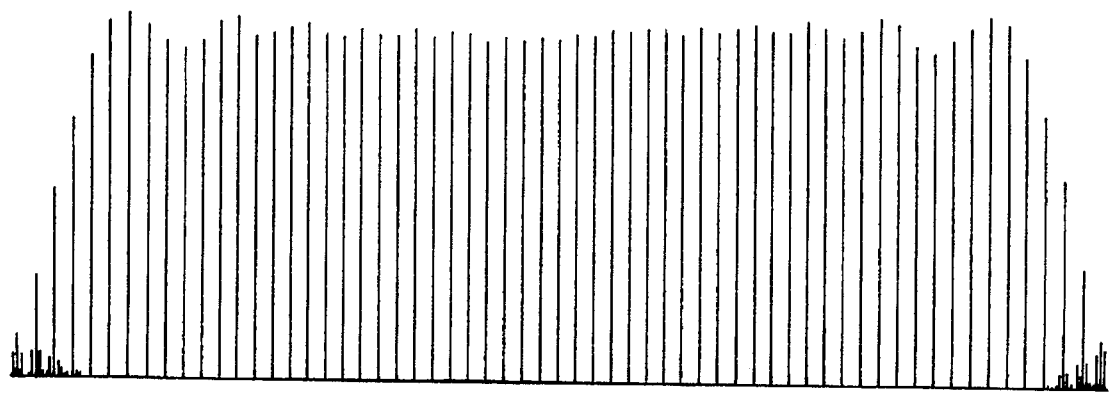
Figure 4C:
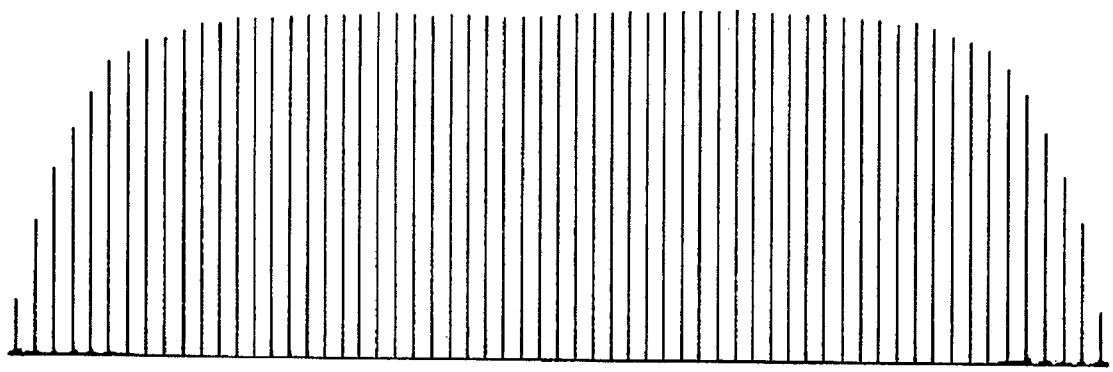

The simple chirp pulse of FIG. 1(a) was used in combination with chirp cycles R and R̄ and 80 step supercycle 70 for each of FIGS. 4(a–c). A single $^{13}$C 90 degree observation pulse was also generated prior to generation of the supercycles 70 to condition the sample. The amplitudes of the chirp pulses used in FIGS. 4(a–c) varied. For example, the amplitude of the chirp pulse for FIG. 4(a) was 3.3 kHz, for FIG. 4(b) was 4.2 kHz, and for FIG. 4(c) was 8.2 kHz. The effective decoupling bandwidth $\Delta v^{\mathit{eff}}$ is 52 kHz in FIGS. 4(a–b) and is 50 kHz in FIG. 4(c). The ratio $\Delta v^{\mathit{eff}}/v_{RF}$ is an important figure of merit for decoupling. This ratio is 15.8 for FIG. 4(a), 12.4 for FIG. 4(b), and 6.1 for FIG. 4(c). The ratio of the effective decoupling bandwidth over the bandwidth of the RF sweep is approximately 0.87 for FIGS. 4(a–c). After exponential broadening of 0.3 Hz used in all experiments, the linewidth was 0.74 Hz in FIG. 4(a), 0.76 Hz in FIG. 4(b), and 0.82 Hz in FIG. 4(c). The $^{13}$C linewidth of the undecoupled doublet was 0.74 Hz.

FIGS. 5(a–c) show expanded views of the center of the range of the signals shown in FIGS. 4(a–c). In particular, FIG. 5(a) shows the center line of the spectra shown in FIG. 4(a) without magnification. FIG. 5(a') shows the same center line but magnified six times. FIGS. 5(b) and (c) show the center line of the spectra shown in FIGS. 4(b) and (c), respectively, again magnified six times.

The magnified views of FIGS. 5(a–c) more clearly show the sidebands due to the chirp cycles R and R̄ and the supercycle 70. The sideband intensities depend on the J-coupling constant and the length τ of each individual chirp pulse. As seen in FIGS. 5(a–c), the sideband intensities are not strongly affected by the RF amplitude. For example, with an RF amplitude set to the minimum threshold for the reported data of 3.3 kHz, the strongest sidebands are below 3.3% of the centerband amplitude and appear at ±37.5 Hz as shown in FIG. 5(a). 37.5 Hz is the reciprocal of one third of the duration of 80 τ=80 ms of the full supercycle 70. When the constant decoupling amplitude is increased to 4.2 kHz, the strongest sidebands are at 1.5% of the centerband amplitude and appear at ±500 Hz as shown in FIG. 5(b). 500 Hz is the reciprocal of 2τ. When the constant decoupling amplitude is increased to 8.2 kHz, the sidebands remain at 1.5% of the centerband amplitude and appear at ±500 Hz as shown in FIG. 5(c).

In practice, the parameters of a chirp pulse must be chosen depending on the range of chemical shifts to be decoupled and on the magnitude of the heteronuclear scalar coupling constant J. In systems with very large J-coupling constants, the use of higher RF amplitudes and shorter pulses may be necessary. To reduce the sideband intensities, the duration τ of the individual chirp pulses should be much shorter than 1/J. As higher and higher magnetic fields are becoming available, chemical shift range increases steadily. In an NMR spectrometer equipped with a 23.5T magnet (1000 MHz for protons), isotropic fluorine-19 resonances spreading over 100 ppm and phosphorous-31 spectra spreading over 500 ppm will require decoupling over 94 and 200 kHz, respectively. Thus, prescriptions which allow for decoupling over essentially unlimited bandwidths are necessary.

The optimum RF amplitude of a linear chirp pulse is related to the bandwidth and to the duration τ of the chirp pulse as follows:

$$v_{RF,opt} \propto a^{1/2} \qquad [1]$$

In equation [1], $a = \Delta v^{\mathit{sweep}}/\tau$ is the sweep rate of the chirp pulse. Thus, the bandwidth $\Delta v^{\mathit{sweep}}$ can be doubled while keeping the same pulse length if the RF amplitude is increased by a factor of $2^{1/2}$. The bandwidth can also be doubled by keeping the same RF amplitude but doubling the pulse length and assuming that the sideband intensities remain reasonably small. As an example, an experiment was run with a pulse length τ=1 ms, a bandwidth sweep $\Delta v^{\mathit{sweep}}=$ 120 kHz, and an RF amplitude $v_{RF}=6.2$ kHz. The resulting effective decoupling bandwidth was 108 kHz for a ratio $\Delta v^{\mathit{eff}}/v_{RF}=17.4$.

In practice, extremely wide bandwidths can be swept depending on the range of the chemical shift to be decoupled. The primary limitation on the bandwidth arises from the speed of the digital electronics in the spectrometer. The results reported here used 256 points for each 1 ms chirp pulse, i.e., the time increments were 3.9 microseconds. Those skilled in the art will recognize that broader decoupling bandwidths will be obtained within the scope of the invention by the mere use of faster electronics and/or shorter time increments than those used here.

Figure 6:
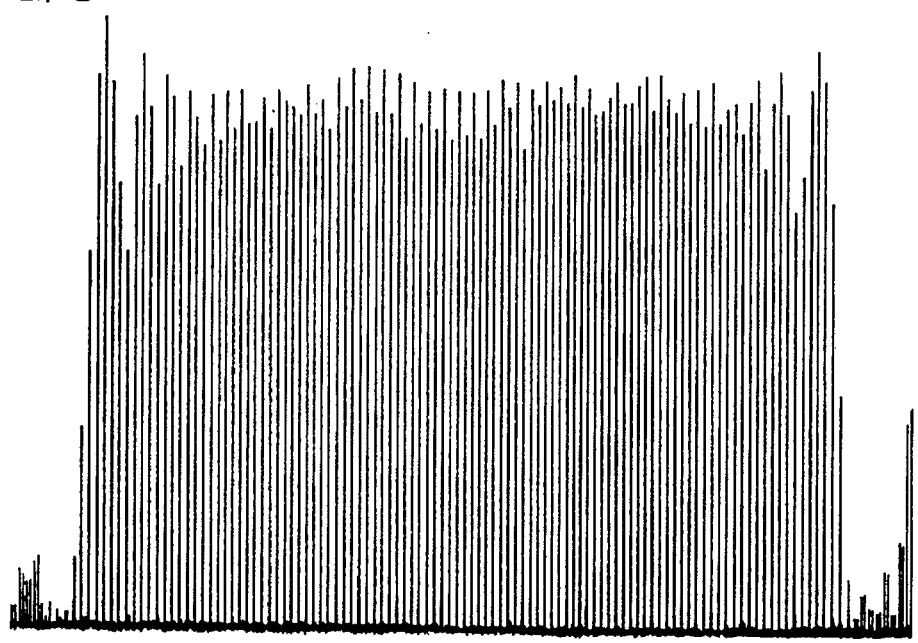
FIG. 6 shows experimental carbon-13 spectra of formic acid detected using chirp pulses swept over a bandwidth of 220 kHz.

For example, FIG. 6 shows experimental $^1$H decoupled $^{13}$C spectra of formic acid with $J_{CH}=221$ Hz. These signals or spectra were recorded as a function of offset between the center of the chirp range and the proton shift. The offset was stepped in 121 increments of 2 kHz from −120 to +120 kHz. The spectral width plotted for each experiment was 500 Hz so that residual splittings and modulation sidebands can be seen. As shown, the sideband intensities are reasonably small.

The chirp pulses used for collecting the data shown in FIG. 6 were of the general form shown in FIG. 1(a) but using different parameters. The linear frequency sweep was $\Delta v^{\mathit{sweep}}=220$ kHz. The pulse width τ for these chirp pulses was 1.2 msec. The time slice or time increment was 1.17 microseconds using 1024 digital points as compared to the 3.9 microseconds time increment reported above. The RF amplitude was v=6.7 kHz. The effective decoupling bandwidth $\Delta v^{\mathit{eff}}$ was 202 kHz for an effective decoupling bandwidth ratio $\Delta v^{\mathit{eff}}/v_{RF}$ of 30.1. The chirp pulses were organized into the cycles and supercycle shown in FIG. 2. As above, a single $^{13}$C 90 degree observation pulse was generated prior to generation of the supercycles. As described above for FIGS. 1(a–b), the 220 kHz frequency sweep was implemented by setting the chirp pulses to the central frequency and varying the phase instead of varying the frequency over the 220 kHz bandwidth.

In sample volumes that are close to the transmitter surface coil of an in vivo NMR spectrometer, the RF amplitude may be much larger than the threshold. In such cases, simple linear chirp pulses with constant amplitudes may not be very effective because the adiabatic condition can be severely violated. In this circumstance, it is preferable to use apodized chirp pulses as shown in FIG. 1(b). Apodization improves adiabatic behavior during the inversion of magnetization. Simulations of high power levels above levels that might not be safe for high-resolution probes, e.g., 20 kHz, show that a simple chirp pulse degrades near the ends of the sweep. Apodization improves the decoupling efficiency significantly even though the effective decoupling bandwidth decreases from 52 to 48 kHz. The decoupling efficiency is remarkably tolerant of variations in the RF amplitude. This compares favorably with composite pulse decoupling methods where the efficiency depends critically on the calibration of the RF amplitude. Chirp decoupling should therefore be useful for in vivo NMR where the RF field is often very inhomogeneous. By using chirp decoupling sequences, uniform decoupling in a large sample volume is possible.

Figure 7:
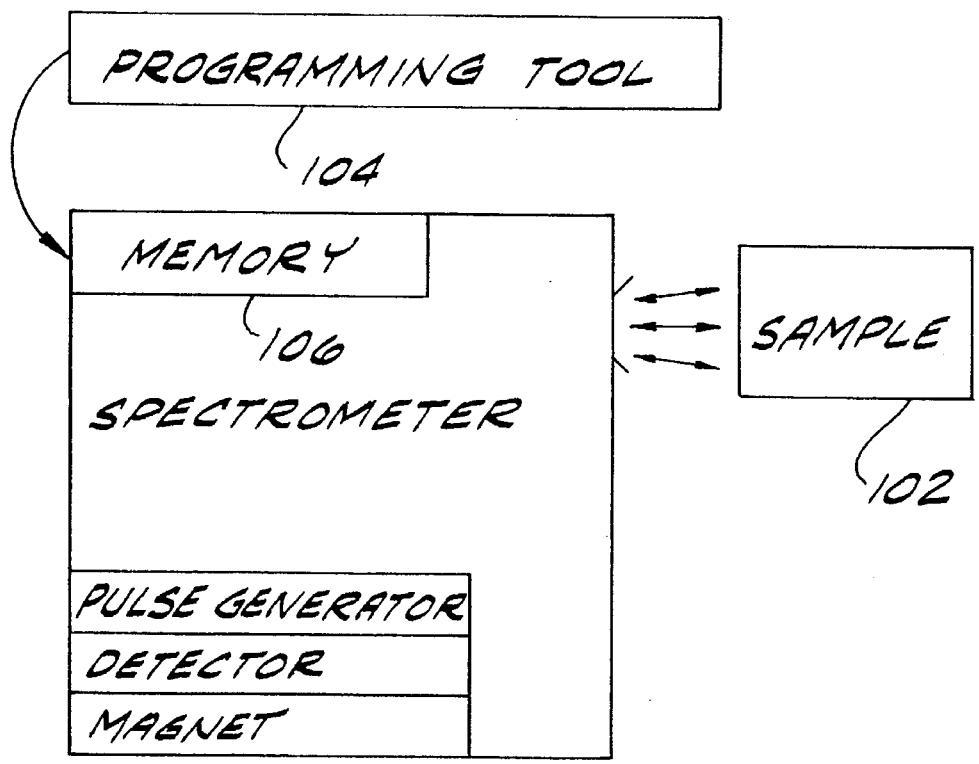
FIG. 7 shows a block diagram of a spectrometer and related apparatus for practicing the invention.

The experimental results shown in FIGS. 4(a–c) and 5(a–c) can be obtained with the apparatus shown in block diagram form in FIG. 7. In particular, FIG. 7 shows a spectrometer 100 such as the Bruker Model DMX-300 spectrometer ($B_0$=7T) with Larmor frequencies of 75.46 MHz for $^{13}$C and 300.13 MHz for $^{1}$H. A sample 102 is, for example, formic acid (HCOOH, $J_{CH}$=221 Hz) in natural isotopic abundance with $D_2O$ for field-frequency lock. The waveforms of the chirp pulses can be programmed with MATLAB via a programming tool 104 and are transferred directly to a memory 106 in spectrometer 100. Other suitable programming tools known by those skilled in the art may also be used. The decoupling sequences may be applied to the $^{1}$H during the acquisition of the $^{13}$C signals. The decoupling sequences may also be applied to the $^{13}$C during the acquisition of the $^{1}$H signals. Other combinations of nuclei are also possible. For each experiment shown in FIGS. 4(a–c) and 5(a–c), 32 scans were accumulated with a recycle time of 3 seconds. A Lorentzian line-broadening factor of 0.3 Hz was applied for all spectra. The radio frequency amplitudes were separately calibrated with square pulses using the same attenuation levels as for decoupling.

The experimental results shown in FIG. 6 can also be obtained with the apparatus and sample shown in FIG. 7. The low decoupling amplitude of 6.7 kHz protects the high resolution probe in spectrometer 100. The decoupling amplitude is preferably set below about 10 kHz and, as here, may be below 7 kHz. As with the spectra shown in FIGS. 4(a–c) and 5(a–c), the center of the frequency sweep for the chirp pulses was set to the Larmor frequency, 300.13 MHz. It is seen then that the invention can be practiced using chirp pulses having a frequency sweep of at least about 100 kHz, 150 kHz and 200 kHz. Even broader frequency sweeps are also contemplated within the scope of the invention as required by the range of the chemical shift to be decoupled.

The experimental results thus demonstrate an inventive method of decoupling scalar or dipolar couplings over virtually unlimited bandwidths using chirp pulses organized into cycles and supercycles. This allows for decoupling with limited RF power while still being tolerant of RF inhomogeneity and giving narrow residual linewidths and weak modulation sidebands.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of decoupling a scalar or dipolar coupling between nuclei in a sample by inverting a longitudinal magnetization in the sample, the method comprising the steps of:

positioning the sample in a static magnetic field;

defining a first cycle of chirp pulses, at least two of said chirp pulses in the first cycle having a different initial phase angle from each other;

defining a second cycle of chirp pulses, at least two of said chirp pulses in the second cycle having an initial phase angle different from the initial phase angles of chirp pulses in the first cycle;

generating a supercycle comprising a plurality of the first and second cycles so that the first and second cycles are repeatedly generated as a function of the supercycle to produce chirp pulses for inverting the longitudinal magnetization in the sample; and detecting the signals emitted by the sample in response to inversion of the longitudinal magnetization.

2. The method of claim 1 wherein the second mentioned defining step comprises the step of defining the second cycle of chirp pulses to have their initial phase angles advanced about 180 degrees from the initial phase angles of chirp pulses in the first cycle.

3. The method of claim 1 wherein the first mentioned defining step comprises the step of defining the first cycle to include five chirp pulses; wherein the first and fifth chirp pulses in the first cycle have an initial phase angle of about zero degrees; wherein the second and fourth chirp pulses in the first cycle have an initial phase angle of about 150 degrees; and wherein the third chirp pulse in the first cycle has an initial phase angle of about 60 degrees.

4. The method of claim 3 wherein the second mentioned defining step comprises the step of defining the second cycle to include five chirp pulses; wherein the first and fifth chirp pulses in the second cycle have an initial phase angle of about 180 degrees; wherein the second and fourth chirp pulses in the second cycle have an initial phase angle of about 330 degrees; and wherein the third chirp pulse in the second cycle has an initial phase angle of about 240 degrees.

5. The method of claim 1 wherein at least three of the chirp pulses in the first cycle have different initial phase angles from each other.

6. The method of claim 1 wherein the generating step comprises the step of generating the supercycle having a total of sixteen first and second cycles; wherein the first cycle fills positions 1, 2, 6, 7, 11, 12, 13 and 16 of the supercycle; and wherein the second cycle fills positions 3, 4, 5, 8, 9, 10, 14 and 15 of the supercycle.

7. The method of claim 1 wherein the first mentioned defining step comprises the step of defining the first cycle of chirp pulses to include a plurality of linear frequency modulated chirp pulses.

8. The method of claim 1 wherein the first mentioned defining step comprises the step of defining the first cycle of chirp pulses to include a plurality of constant amplitude chirp pulses.

9. The method of claim 8 further comprising the step of apodizing the amplitude of the chirp pulses at the beginning and end of the chirp pulses.

10. The method of claim 8 wherein the first mentioned defining step comprises the step of defining the first cycle of chirp pulses to include a plurality of chirp pulses which vary in phase or frequency to result in a frequency sweep of at least about 200 kHz in less than about 1.5 milliseconds.

11. The method of claim 1 wherein the first mentioned defining step comprises the step of defining the first cycle of chirp pulses to include a plurality of chirp pulses which vary in phase or frequency to result in a frequency sweep of at least about 200 kHz in less than about 1.5 milliseconds.

12. The method of claim 1 wherein the first mentioned defining step comprises the step of defining the first cycle of chirp pulses to include a plurality of chirp pulses which vary in phase or frequency to result in a frequency sweep of at least about 60 kHz in about one millisecond.

13. A method of decoupling a scalar or dipolar coupling between nuclei in a sample by inverting a longitudinal magnetization in the sample, the method comprising the steps of:

positioning the sample in a static magnetic field;

defining a first cycle of chirp pulses having a varying phase or varying frequency to result in a frequency sweep of at least about 100 kHz;

defining a second cycle of chirp pulses having a varying phase or varying frequency to result in a frequency sweep of at least about 100 kHz;

generating a supercycle comprising a plurality of the first and second cycles so that the first and second cycles are repeatedly generated as a function of the supercycle to produce chirp pulses for inverting the longitudinal magnetization in the sample; and detecting the signals emitted by the sample in response to inversion of the longitudinal magnetization.

14. The method of claim 13 wherein the generating step comprises the step of generating the supercycle having a total of sixteen first and second cycles; wherein the first cycle fills positions 1, 2, 6, 7, 11, 12, 13 and 16 of the supercycle; and wherein the second cycle fills positions 3, 4, 5, 8, 9, 10, 14 and 15 of the supercycle.

15. The method of claim 13 wherein the first mentioned defining step comprises the step of defining the first cycle of chirp pulses to have a varying phase or varying frequency to result in a frequency sweep of at least about 150 kHz.

16. The method of claim 15 wherein the first mentioned defining step comprises the step of defining the first cycle wherein each of the chirp pulses in the first cycle has an amplitude below about 10 kHz.

17. The method of claim 13 wherein the first mentioned defining step comprises the step of defining the first cycle of chirp pulses to have a varying phase or varying frequency to result in a frequency sweep of at least 200 kHz.

18. The method of claim 17 wherein the first mentioned defining step comprises the step of defining the first cycle wherein each of the chirp pulses in the first cycle has an amplitude below about 10 kHz.

19. The method of claim 17 wherein the first mentioned defining step comprises the step of defining the first cycle wherein each of the chirp pulses in the first cycle has an amplitude below about 7 kHz.

20. The method of claim 19 wherein the first mentioned defining step comprises the step of defining the first cycle wherein each of the chirp pulses in the first cycle has a duration less than about 1.5 milliseconds.

21. The method of claim 13 wherein the first mentioned defining step comprises the step of defining the first cycle wherein each of the chirp pulses in the first cycle has a duration less than about 1.5 milliseconds.

22. The method of claim 13 wherein the first mentioned defining step comprises the step of defining the first cycle wherein each of the chirp pulses in the first cycle has an amplitude below about 10 kHz.

23. The method of claim 22 wherein the first mentioned defining step comprises the step of defining the first cycle wherein each of the chirp pulses in the first cycle has a duration less than about 1.5 milliseconds.

24. A method of decoupling a scalar or dipolar coupling between nuclei in a sample by inverting a longitudinal magnetization in the sample, the method comprising the steps of:

positioning the sample in a static magnetic field;

defining a first cycle of linear frequency modulated RF pulses, each of the RF pulses in the first cycle having an amplitude which is substantially constant during at least about 50% of said pulses;

defining a second cycle of linear frequency modulated RF pulses, each of the RF pulses in the second cycle having an amplitude which is substantially constant during at least about 50% of said pulses;

generating a supercycle comprising a plurality of the first and second cycles so that the first and second cycles are repeatedly generated as a function of the supercycle to produce RF pulses for inverting the longitudinal magnetization in the sample; and detecting the signals emitted by the sample in response to inversion of the longitudinal magnetization.

25. The method of claim 24 wherein the first mentioned defining step comprises the step of defining the first cycle wherein each of the RF pulses in the first cycle has an amplitude below about 10 kHz.

26. The method of claim 24 wherein the first mentioned defining step comprises the step of defining the first cycle wherein each of the RF pulses in the first cycle has an amplitude below about 6 kHz.

27. The method of claim 24 wherein the first mentioned defining step comprises the step of defining the first cycle wherein each of the RF pulses in the first cycle has an amplitude below about 4 kHz.

28. Apparatus for decoupling a scalar or dipolar coupling between nuclei in a sample by inverting a longitudinal magnetization in the sample, the apparatus comprising:

a magnet for producing a static magnetic field within which the sample is positioned;

a memory for storing data defining a first cycle of chirp pulses, at least two of said chirp pulses in the first cycle having a different initial phase angle from each other; the data further defining a second cycle of chirp pulses, at least two of the chirp pulses in the second cycle having an initial phase angle different from the initial phase angles of chirp pulses in the first cycle; the data further defining a supercycle comprising a plurality of the first and second cycles;

a pulse generator responsive to the memory for repeatedly generating a plurality of chirp pulses as a function of the supercycle of the defined first and second cycles, said pulses being applied to the sample for inverting the longitudinal magnetization in the sample; and a detector for detecting the signals emitted by the sample in response to inversion of the longitudinal magnetization.

29. Apparatus for decoupling a scalar or dipolar coupling between nuclei in a sample by inverting a longitudinal magnetization in the sample, the apparatus comprising:

a magnet for producing a static magnetic field within which the sample is positioned;

a memory for storing data defining a first cycle of chirp pulses, at least two of said chirp pulses in the first cycle having a varying phase or varying frequency to result in a frequency sweep of at least about 100 kHz; the data further defining a second cycle of chirp pulses, at least two of the chirp pulses in the second cycle having a varying phase or varying frequency to result in a frequency sweep of at least about 100 kHz; the data further defining a supercycle comprising a plurality of the first and second cycles;

a pulse generator responsive to the memory for repeatedly generating a plurality of chirp pulses as a function of the supercycle of the defined first and second cycles, said pulses being applied to the sample for inverting the longitudinal magnetization in the sample; and a detector for detecting the signals emitted by the sample in response to inversion of the longitudinal magnetization.

30. Apparatus for decoupling a scalar or dipolar coupling between nuclei in a sample by inverting a longitudinal magnetization in the sample, the apparatus comprising:

a magnet for producing a static magnetic field within which the sample is positioned;

a memory for storing data defining a first cycle of linear frequency modulated RF pulses, each of the RF pulses in the first cycle having an amplitude which is substantially constant during at least about 50% of said pulses; the data further defining a second cycle of linear frequency modulated RF pulses, each of the RF pulses in the second cycle having an amplitude which is substantially constant during at least about 50% of said pulses; the data further defining a supercycle comprising a plurality of the first and second cycles;

a pulse generator responsive to the memory for repeatedly generating a plurality of RF pulses as a function of the supercycle of the defined first and second cycles, said pulses being applied to the sample for inverting the longitudinal magnetization in the sample; and a detector for detecting the signals emitted by the sample in response to inversion of the longitudinal magnetization.

* * * * *